United States Patent [19]
Farb et al.

[11] Patent Number: 5,185,535
[45] Date of Patent: Feb. 9, 1993

[54] CONTROL OF BACKGATE BIAS FOR LOW POWER HIGH SPEED CMOS/SOI DEVICES

[75] Inventors: Joseph E. Farb, Riverside; Mei Li, Mission Veijo; Chen-Chi P. Chang, Newport Beach; Maw-Rong Chin, Huntington Beach, all of Calif.

[73] Assignee: Hughes Aircraft Company, Los Angeles, Calif.

[21] Appl. No.: 716,151

[22] Filed: Jun. 17, 1991

[51] Int. Cl.⁵ .................................. H01L 27/01
[52] U.S. Cl. ............................ 257/351; 257/365; 257/369; 257/901; 437/21; 437/34; 437/40; 437/84
[58] Field of Search ................ 357/23.7, 4, 42; 437/21, 34, 40, 84

[56] References Cited

U.S. PATENT DOCUMENTS 4,996,575  2/1991  Ipri et al. ..................... 357/23.7
5,103,277  4/1992  Caviglia et al. ................ 357/23.7

Primary Examiner—Edward J. Wojciechowicz
Attorney, Agent, or Firm—Terje Gudmestad; Jeannette M. Walder; W. K. Denson-Low

[57] ABSTRACT

Complimentary metal oxide silicon transistors fabricated on silicon-on-insulator substrates are configured to allow separately controllable and independent backgate bias for adjacent complimentary devices on the same substrate. By means of deep implantation of boron, a backgate bias P— well (26,126) is positioned on the N-substrate (17,117) at a front surface of the N— substrate behind the N channel transistor of a complimentary pair. The backgate bias P— well (26,126) is provided with an electrical contact (48,148) at the front of the device, as is the N— silicon substrate to enable independent application of separate bias voltage of different polarities and appropriate magnitude.

13 Claims, 2 Drawing Sheets

CONTROL OF BACKGATE BIAS FOR LOW POWER HIGH SPEED CMOS/SOI DEVICES

BACKGROUND OF THE INVENTION

1. Field of the Invention

The present invention relates to semiconductor devices and more specifically to complementary devices fabricated on a common silicon-on-insulator (SOI) substrate and configured for minimizing leakage currents.

2. Description of Related Art

Complementary metal oxide silicon (CMOS) devices fabricated on silicon-on-insulator (SOI) substrates have advantages of high speed, high circuit packing density, latch up freedom and radiation hardening. Nevertheless, as device geometries are scaled down to one micron and sub-micron levels, leakage greatly increases. Floating substrates, impact ionizations, bi-polar effect, punch throughs, body effect, back channel turn-ons, zener diode breakdowns, hot electron degradation and the like all contribute to the high leakages in such devices. Leakages on high speed sub-micron silicon-on-insulator devices are much higher because of likelihood of back channel device turn-ons with a fixed substrate bias. By more heavily doping the depletion area between the source and drain, leakage can be reduced. However, this makes the transistor more difficult to turn on, and, in addition, provides lower operating voltages. It also may require a thinner depletion layer and decrease speed of the devices.

In devices of this type the complementary transistors are fabricated on a common substrate, such as, for example, a silicon N−substrate. Backgate biasing of such devices, as by application of voltage to the N−substrate, is desirable to minimize leakage and prevent soft turn-ons.

In attempting to reduce leakage in the CMOS/SOI devices, a positive voltage applied directly to the Nsilicon substrate, which is separated from the depletion region of the P channel transistor by a silicon oxide layer, can provide a voltage of a magnitude appropriate for control of leakage of the P channel device. However, because the adjoining N channel device is on the same N−silicon substrate, a positive voltage applied to the substrate will tend to cause conduction rather than reduced leakage of the N channel transistor. Thus it is common to reduce the desired level of positive backgate bias of the P channel transistor as a compromise with the desire to avoid unwanted conduction of the N channel transistor. Moreover, this necessity of balancing backgate bias for the two complementary adjacent transistors imposes limitations on processing conditions which increase the difficulty of the processing if the unwanted leakage is to be minimized.

Accordingly, it is an object of the present invention to provide CMOS devices fabricated on silicon-on-insulator substrates that minimize or eliminate above mentioned problems.

SUMMARY OF THE INVENTION

In carrying out principles of the present invention separate and opposite polarity voltages for backgate bias are provided for P channel and N channel devices by effectively providing independent and separate back sides in the silicon-on-insulator substrate of the two devices. For devices fabricated on a substrate of one conductivity type, such as a N−silicon for example, a back side well of opposite conductivity type, P− in this example, is provided on the substrate adjacent the transistors of one polarity so that separate and independent positive voltage backgate bias for the P channel device and separate and independent negative voltage backgate bias for the N channel device may be applied. A silicon-on-insulator device comprising a semiconductor substrate having an oxide insulator layer has complementary P channel and N channel transistors formed on the oxide layer. To enable separate and independent backgate biasing of the P channel and N channel transistors, a backgate biasing well of opposite conductivity type with respect to the conductivity type of the semiconductor substrate is formed to extend along the semiconductor substrate adjacent transistors of one conductivity type, and separate contact locations are formed for receiving metallic contacts connected directly to the front side of the substrate and to the backgate bias well formed at the front of the substrate.

DESCRIPTION OF THE PREFERRED EMBODIMENT

FIGS. 1 through 5 illustrate certain steps in the process of fabricating a complementary metal oxide silicon/silicon-on-insulator device, such as, for example, a complementary metal oxide silicon (CMOS)/separation by ion implanted oxygen (SIMOX). Except for certain additional steps, as will be particularly described below, the process employed herein with respect to the manufacture of CMOS/SIMOX device is described in full and complete detail in the co-pending application for High Speed Silicon-On-Insulator Device and Process of Fabricating Same, Ser. No. 07/481,032, Filed Feb. 16, 1990. The disclosure of such pending application is incorporated herein by this reference as though fully set forth. Steps in this process are set forth below.

Figure 1:
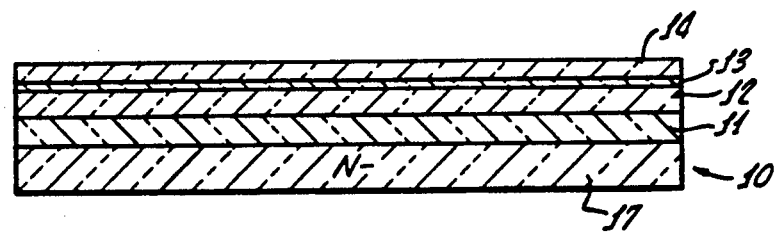
FIGS. 1, 2, 3, and 4 show various intermediate steps in the fabrication of a CMOS/SIMOX device.

Fabrication of the CMOS/SIMOX device starts with a SIMOX wafer 10, as shown in FIG. 1, which comprises a separation by implanted oxygen wafer having a 2400 angstrom layer of silicon 12 on a 3600 angstrom buried oxide layer 11. Initially a layer of oxidation 13, approximately 500 angstroms thick, is formed on the surface of silicon 12, and a layer of nitride 14, approximately 1200 angstroms thick, is deposited on the oxide layer 13.

An oversized mask is employed to etch the silicon nitride. The nitride and oxide layers 13 and 14 are removed after selective oxidation. These steps result in the intermediate configuration illustrated in FIG. 2.

Figure 3:
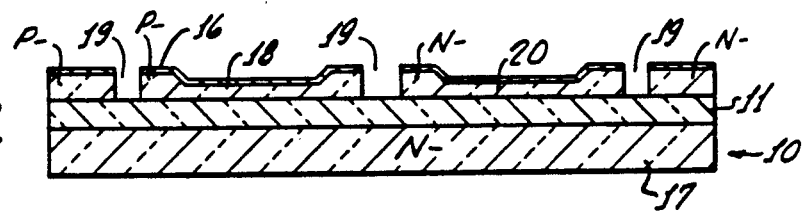

Thereafter a 200 angstrom oxide layer 16 is thermally grown, and standard procedures are employed for masking and implantation of positively charged boron ions (B+) and positively charged phosphorus (Ph+) to obtain conventional and standard P−well 18 and N−well 20, as shown in FIG. 3. FIG. 3 also illustrates the result of a further step comprising the masking to define the active areas of the P channel and N channel devices on the left and right side of the illustration, respectively, by masking and etching through the oxide 16 and implanted silicon 18 in regions 19.

The steps described to this point result in an intermediate configuration, as illustrated in FIG. 3.

Figure 4:
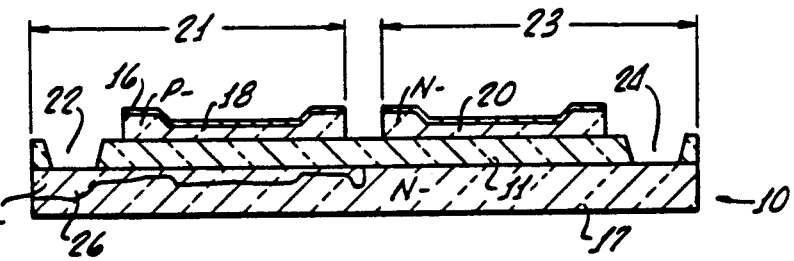

At this point in the process the method of the present invention departs from that of the above identified co-pending application, for High Speed Silicon-On-Insulator Device and Process of Fabricating Same. A mask for defining a tie-down to the silicon dioxide or buried oxide layer 11 of the wafer 10 is employed to provide regions 22 and 24 (FIG. 4) at which the silicon substrate 17 is exposed. After masking the N—well area 20, the P—well area 18 is exposed to a deep boron implant employing a power in the order of 180 Kev. This deep implant over the P well area results in the formation of a P—well area 26 extending entirely under the N channel device on the left side of the figure. In FIG. 4 the completed N channel transistor will be located in the area indicated by numeral 21 and the completed P—channel transistor will be located in the area indicated by numeral 23. The elongated P—well 26 formed by the deep boron implant extends along the back of the N channel transistor and effectively provides a back-gate for the transistor that is to be formed upon the oxide layer 11. The deep implant provides the P well 26 along the forward surface of the N—silicon layer 17 and extends into the layer 17 to a depth that varies according to the thickness of the overlying layers, namely those between the silicon layer 17 and the implant source. The implant source projects the boron ion implants downwardly, as viewed in FIG. 4, through P—well 18 and through the oxide 11 into the silicon layer 17.

Figure 5:
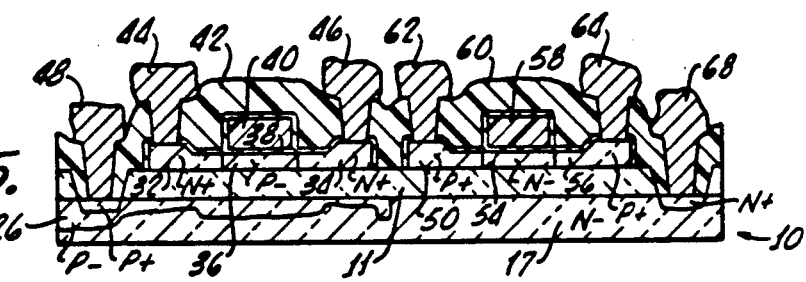
FIG. 5 illustrates a section through a completed CMOS/SIMOX device.

Now the remaining standard processes, as described in the above identified co-pending application for High Speed Silicon-On-Insulator Device and Process of Fabricating Same are continued. Briefly these steps include the removal of the 200 angstrom oxide layer, the standard processes for gate oxidation, deposition of the polysilicon gates, gate formation and source and drain formations. Final steps include deposition of the borophosphate silicate glass and the contact and metal deposition and delineation. The final configuration, as illustrated in FIG. 5, shows the silicon layer 17 having the P well 26 extending beneath the N channel device under the oxide layer 11, with N+source and drain regions 32,34 separated by a P—region 36, over which extends an oxide layer 38 and a polysilicon gate 40. The insulating borophosphate silicate glass 42 covers the transistor, which has metallic contacts 44,46 for its source and drain. A P+contact 48 connects to the backgate bias P—well 26. Similarly, the N channel transistor includes a source and drain 50,52 separated by an N—region 54 and overlaid with an oxide layer 56 which separates the gate 58 from the P+and N—regions of the transistor. The insulation of borophosphate silicate glass 60 overlies the P channel transistor, which is provided with metallic source and drain contacts 62,64. An N+substrate contact 68 is also formed in contact with the silicon layer 17 to provide for backgate bias for the P channel transistor.

Illustrated in FIGS. 6 through 9 are certain steps followed in applying principles of the present invention to manufacture of a high speed, low leakage radiation hardened semiconductor device. The steps illustrate application to a CMOS/SIMOX device.

As previously described in connection with FIG. 1, the process starts with a SIMOX wafer 110 having a base or substrate layer 117 of silicon, an internal layer 111 of silicon oxide in the order of 3600 angstroms thick and a top layer 12 of silicon in the order of 2400 angstroms thick. Except as will be particularly pointed out below, the steps in the fabrication of this device are the same as those described in a co-pending application of Chen-Chi P. Chang and Mei Li for Manufacturing High Speed Low Leakage Radiation Hardened CMOS/SOI Devices, Ser. No. 07/481,148, Filed Feb. 16, 1990. The disclosure of such application is incorporated herein by reference as though fully set forth.

Figure 2:
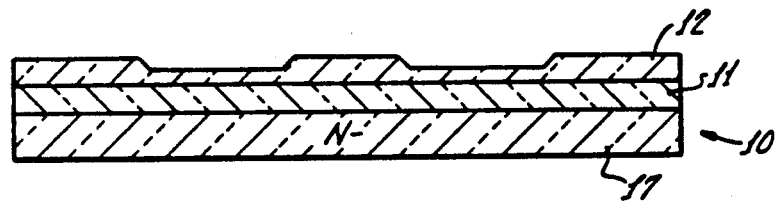
Figure 6:
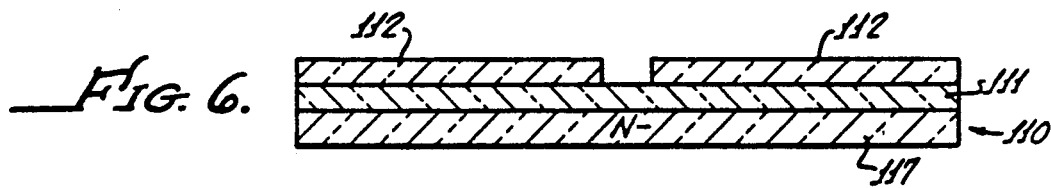
FIGS. 6, 7 and 8 illustrate different stages in the processing of a radiation hardened CMOS/SIMOX device.
Figure 7:
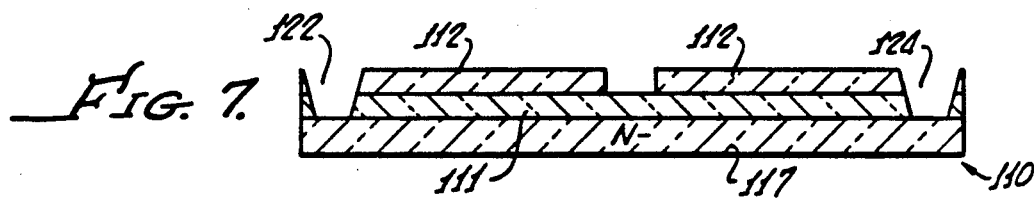
Figure 8:
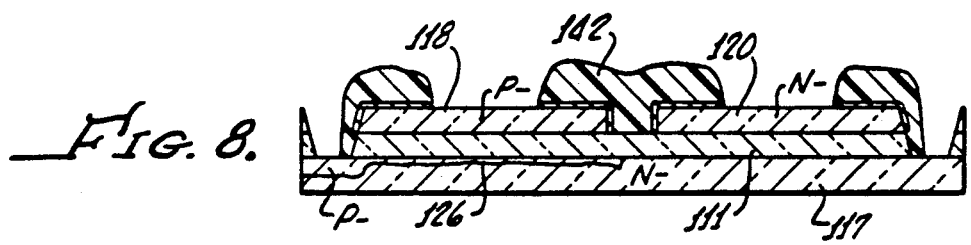

FIG. 6 illustrates an intermediate configuration of the device, after the separation mask has been employed to etch through the silicon and define the different wells for each of the regions of the radiation hardened device. After obtaining the configuration illustrated in FIG. 6 a special silicon-on-insulator tie-down mask (not used in the process of the above identified patent application for Manufacturing High Speed Low Leakage Radiation Hardened CMOS/SOI Devices) is employed to etch through the silicon 112 and oxide 111 to the lower silicon layer 117, forming depressions 122 and 124 which will receive metal contacts for application respectively to the substrate 117 and to a P—well to be formed therein, as will be described below. In general, the separation mask (FIG. 6) and the tie-down mask (FIG. 7) can be combined in this process In forming the depressions 122 and 124 the P channel side of the device, to the right as illustrated in FIG. 2, is masked to perform the N channel implant, which is a shallow implant, to provide the shallow P well 118 shown in FIG. 8. Thereafter a deep boron ion implant is provided, employing a power of about 180 Kev, as in the arrangement of FIGS. 1 through 5, to create the backgate bias P well 126 in a forward portion of the silicon layer 117 and extending along the entire N channel area.

After forming the backgate bias P well 126 by the deep boron implant, the subsequent steps are the same as those previously carried out and as described in detail in the above mentioned co-pending application for Manufacturing High Speed Low Leakage Radiation Hardened CMOS/SOI Devices. These additional steps, as more particularly described in the identified co-pending application, include the N well masking and implant for the N well 120, annealing of the device, the application of the 500 angstrom layer of oxide and a 5000 angstrom layer of borophosphate silicate glass 142, and radiation active masking and oxide etch. This is followed by the standard processing to deposit gate oxidation, polysilicon deposition and formation of the gate and source and drain. Thereafter metal for the contacts is deposited and the various contacts specifically delineated.

Figure 9:
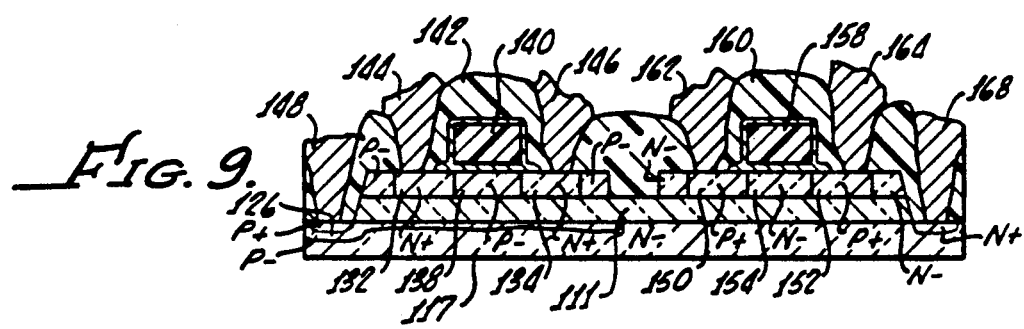
FIG. 9 is a cross section of a completed radiation hardened CMOS/SIMOX device.

The resulting final product is illustrated in FIG. 9 and includes the N—silicon base 117 at the forward surface of which, behind the N channel device, is formed the backgate bias P well 126. Oxide layer 111 underlies the N channel transistor which has source and drain 132, 134 separated by a depletion region 138 (which in the radiation hardened device is thicker than its counterpart in the normal device of FIGS. 1 through 5), with a polysilicon gate 140 covered by the glass insulation 142. Metal contacts 144 and 146 connect to the source and drain of the transistor and a backgate bias P+contact 148 connects to the deep P—well backgate in a manner analogous to that described in connection with the normal device of FIGS. 1 through 5. Similarly, for the P channel device, the process results in a P+source and drain 150,152 separated by a N−depletion region 154, and having a polysilicon gate 158 separated from the source, drain and depletion regions by an oxide layer 156. Glass insulation 160 overlies the transistor, which has metal contact 162 and 164 connected to its source and drain. A backgate bias N+contact 168 connects to the N−silicon substrate 117.

It will be seen that features of the devices described herein enable completely separate and independent back biasing of both of the complementary transistors formed on the common silicon substrate 117. As previously described, a positive backgate bias, which is applied in the described embodiment by the contact 68 of FIG. 5, will help to maintain the P channel transistor, having source and drains 50,56 in an off state to prevent leakage in this transistor. In previous arrangements of CMOS/SIMOX devices application of such a positive bias would tend to cause the N channel device having source and drain 32,34 to exhibit increased leakage so that it was difficult, if not the transistors of a pair of complimentary transistors. In the present arrangement, on the other hand, because of the provision of the backgate bias P−well 26 between the silicon layer 17 and the N−channel transistor source and drain 32,34, a separate and independent negative backgate bias voltage may be applied to the P well 26 via contact 48. Accordingly, a desired positive voltage for backgate bias may be applied to the P channel transistor, and, at the same time, the desired negative voltage for backgate bias of the N channel transistor may be applied, with the two backgate vias voltages being independent of one another, and neither affecting the other.

Provision of the separate backgate biasing contacts, such as contacts 48 and 68 of FIG. 5 and 148, 168 of FIG. 9, enables positive tie-down of the P−and N−substrates in addition to enabling independent backgate opposite polarity biasing to reduce leakages in CMOS/SOI devices. This facilitates achievement of low power high speed CMOS devices. The improved leakage devices are achieved by a process which is basically similar in most respects to prior processes, as described in the above identified co-pending applications, and requires only the generation of one additional mask to provide for the fabrication of the back bias contact recesses that will receive the back bias contacts and the additional step of the deep ion implantation to form the P−backgate biasing region for the device.

Another advantage of the ability to apply separate and opposite polarity backgate bias voltages is the fact that the decreased leakage enables the devices to be made with more lightly doped depletion regions.

Although embodiments of the invention have been described in connection with use of N−type silicon-on-insulator wafers, it will be readily appreciated that principles of the invention can equally well be applied to semiconductor devices in which P−type silicon-on-insulator substrates are employed simply by forming a back side N−well with deep implants of doubly ionized phosphorous.

What is claimed is:

1. A silicon-on-insulator device comprising:
   a semiconductor substrate having an oxide insulator layer,
   complementary opposite polarity type P channel and N channel transistors on a front side of said oxide layer,
   a backgate bias region extending in said substrate along said transistor of said first polarity type, said backgate bias region having a polarity opposite said first polarity and opposite the polarity of said semiconductor substrate, and said backgate bias region having a depth that varies according to the thickness of the overlying layers of said transistor, and
   contact means on said backgate bias region for providing backgate bias to said first transistor.

2. The device of claim 1 wherein said backgate bias region extends between said transistor of said first polarity and said semiconductor substrate.

3. The device of claim 1 wherein said semiconductor substrate is of an N−polarity type, wherein said transistor of first polarity type is an N−channel transistor, and wherein said backgate bias region is of a P−polarity type extending along and adjacent said N channel transistor.

4. The device of claim 3 including an electrical contact on said backgate bias region for applying a negative backgate bias to said N−channel transistor.

5. The device of claim 4 including an electrical backgate bias contact on said semiconductor substrate for applying a positive backgate bias voltage to said P channel transistor.

6. A silicon-on-insulator device comprising:
   a semiconductor substrate of a first polarity type having an oxide layer,
   first and second transistors on said oxide layer, said first and second transistors being of opposite polarity type,
   a backgate bias region formed on said semiconductor substrate adjacent the transistor of said first polarity type (N channel), said backgate bias region being of a plurality type opposite the polarity type of said semiconductor substrate, said backgate bias region having a depth that varies according to the thickness of the overlying layers of said first transistors, and
   backgate voltage bias means connected to said backgate voltage bias region for providing a backgate bias voltage to said backgate voltage region.

7. The device of claim 6 wherein said transistor of first polarity type is an N−channel transistor, wherein said substrate comprises an N−type silicon, and wherein said backgate bias region comprises a P−type region formed in a forward surface of said silicon substrate adjacent said N−channel Transistor.

8. The device of claim 6 wherein said fist transistor comprises an N−channel transistor extending along a first active region of said device, said second transistor comprising a P channel transistor extending along a second active region of said device, and wherein said backgate bias region comprises an area of said silicon substrate extending along said first active region and being implanted to provide a P−area.

9. A method of forming a complementary metal oxide semiconductor device comprising:
   forming a multi-layered structure having a silicon substrate and an upper silicon layer separated by a silicon oxide layer,
   forming separate P−and N−active areas in said silicon layer on said silicon oxide layer, forming a backgate bias contact recess area through said silicon and oxide layers to said silicon substrate, processing a portion of said silicon substrate extending along said P—area adjacent said silicon layer to form a backgate bias region, wherein said backgate bias region has a depth that varies according to the thickness of the overlying layers of said recess area and said P—active area, forming P—channel and N—channel transistors on said silicon oxide layer in said first and second active areas, said transistors having drain and source regions, forming electrical contacts to the drains and sources of said transistors, and forming an electrical contact to said backgate bias region of said silicon substrate.

10. The method of claim 9 including the step of forming an electrical connection with the said silicon substrate for providing backgate bias independent of said backgate bias region.

11. The method of claim 9 wherein said step of processing to form a backgate bias region in said silicon substrate comprises implanting boron ions into an upper portion of said silicon substrate by use of a power sufficient to implant the boron ions through said P—active area and through said silicon dioxide area into the silicon substrate.

12. A semiconductor device comprising:

a substrate having an oxide layer, complementary transistors on said oxide layer, said transistors each including a source and drain on one side of the oxide layer and gate between the source and drain with a depletion region formed between the gate and the oxide and between the source and drain, a backgate bias region of the same polarity as the depletion layer, said backgate bias region being formed on said substrate adjacent said oxide layer and extending along the source, drain and depletion layer of one of said transistors, said substrate being of polarity opposite the polarity of said backgate bias region, said backgate bias region having a depth that varies according to the thickness of the overlying layers of said transistor.

13. The device of claim 11 including bias contact means connected to said backgate bias region and said substrate at the side thereof adjacent said oxide layer.

* * * * *